US012765273B1

(12) United States Patent
Yao

(10) Patent No.: US 12,765,273 B1
(45) Date of Patent: Oct. 13, 2026

(54) IMPURITY REDUCTION FOR QUANTUM DEVICES

(71) Applicant: Google LLC, Mountain View, CA (US)

(72) Inventor: Zhimin Jamie Yao, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 456 days.

(21) Appl. No.: 18/355,724

(22) Filed: Jul. 20, 2023

(51) Int. Cl.
*H10N 60/12* (2023.01)
*H10N 60/01* (2023.01)
*H10N 60/80* (2023.01)

(52) U.S. Cl.
CPC ......... *H10N 60/12* (2023.02); *H10N 60/0912* (2023.02); *H10N 60/805* (2023.02)

(58) Field of Classification Search
CPC ... H10N 60/12; H10N 60/0912; H10N 60/805
See application file for complete search history.

(56) References Cited

U.S. PATENT DOCUMENTS

| | | | | |
|---|---|---|---|---|
| 10,957,841 | B2 | 3/2021 | Megrant | |
| 11,600,588 | B1 | 3/2023 | Yao et al. | |
| 11,662,664 | B2 | 5/2023 | Burkett et al. | |
| 2004/0208589 | A1* | 10/2004 | Hobbs | G02B 6/4214 398/115 |
| 2018/0260729 | A1* | 9/2018 | Abdo | B82Y 10/00 |
| 2022/0285819 | A1* | 9/2022 | Tang | C23F 1/20 |
| 2022/0328749 | A1 | 10/2022 | Burkett | |
| 2023/0031455 | A1* | 2/2023 | Deng | H10N 60/0912 |
| 2023/0225223 | A1 | 7/2023 | Burkett et al. | |
| 2023/0263075 | A1* | 8/2023 | Yang | G06N 10/40 438/2 |

* cited by examiner

*Primary Examiner* — Fernando L Toledo
*Assistant Examiner* — Marshall Mu-Nuo Hatfield
(74) *Attorney, Agent, or Firm* — DORITY & MANNING, P.A.

(57) ABSTRACT

One example aspect of the present disclosure is directed to a device including a superconducting tunnel junction. The superconducting tunnel junction includes a first layer. The first layer includes a superconducting material. The superconducting tunnel junction includes a second layer at least partially overlapping the first layer. The second layer includes the superconducting material. The superconducting tunnel junction includes a barrier layer between the first layer and the second layer and a junction area including an overlapping area of the first layer and the second layer. The junction area has a surface area of about 6400 $nm^2$ or less.

17 Claims, 7 Drawing Sheets

IMPURITY REDUCTION FOR QUANTUM DEVICES

FIELD

The present disclosure relates generally to quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems may manipulate information using quantum bits ("qubits"). A qubit may refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a |0>+b |1> The "0" and "1" states of a digital computer are analogous to the |0> and |1> basis states, respectively of a qubit.

SUMMARY

Aspects and advantages of embodiments of the present disclosure will be set forth in part in the following description, or may be learned from the description, or may be learned through practice of the embodiments.

One example aspect of the present disclosure is directed to a device including a superconducting tunnel junction. The superconducting tunnel junction may include a first layer. The first layer may include a superconducting material. The superconducting tunnel junction may include a second layer at least partially overlapping the first layer. The second layer may include the superconducting material. The superconducting tunnel junction may include a barrier layer between the first layer and the second layer and a junction area including an overlapping area of the first layer and the second layer. The junction area has a surface area of about 6400 $nm^2$ or less.

One example aspect of the present disclosure is directed to a device including a superconducting tunnel junction. The superconducting tunnel junction may include a first layer. The first layer may include a superconducting material. The superconducting tunnel junction may include a second layer at least partially overlapping the first layer. The second layer may include the superconducting material. The superconducting tunnel junction may include a barrier layer between the first layer and the second layer and an impurity area proximate to the superconducting tunnel junction. The impurity area defines an area associated with one or more aluminum oxide nodules. The impurity area has a maximum width of about 50 nm or less.

One example aspect of the present disclosure is directed to a method of forming a superconducting tunnel junction. The method may include forming a first superconducting layer on a substrate. The method may include forming a barrier layer on the first superconducting layer. The method may include forming a second superconducting layer on the barrier layer such that the barrier layer is between the first superconducting layer and the second superconducting layer. The method may include removing one or more nodules from the substrate.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
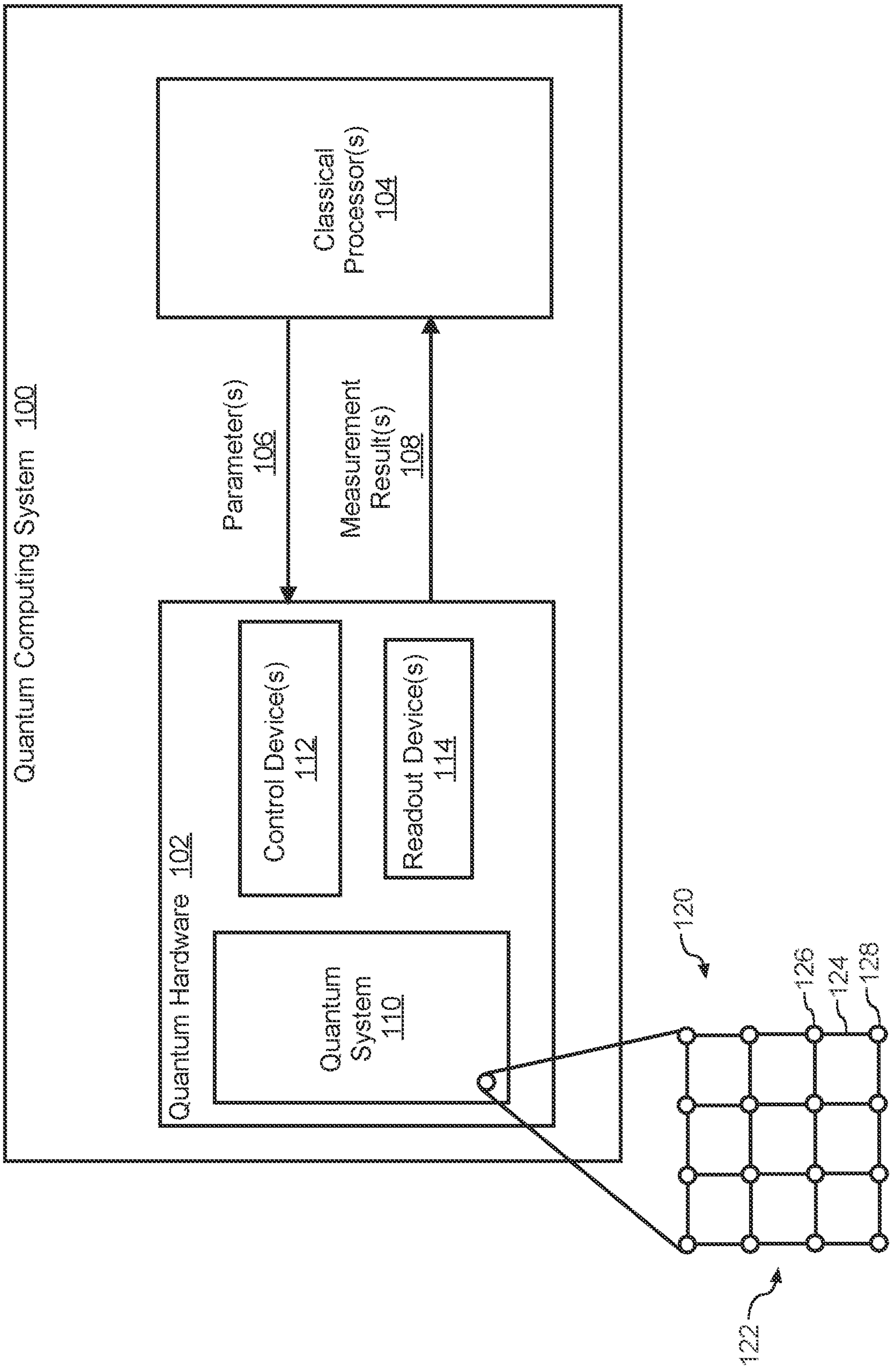
FIG. 1 depicts an example quantum computing system according to example embodiments of the present disclosure.

Example aspects of the present disclosure are directed to quantum computing systems, and more particularly to superconducting qubits used inside quantum computing systems. Certain superconducting qubits, such as transmon qubits, can include superconducting tunnel junction(s) with layers of superconductor and dielectric (e.g., a Josephson junction). Impurities (e.g., excess aluminum oxide) in the surfaces of the superconducting tunnel junction and other components of a qubit (e.g., capacitors and resonators) can produce, for instance, two-level-system defects that limit the coherence of qubits in quantum computing devices (e.g., quantum processors). According to example aspects of the present disclosure, superconducting devices with reduced impurities may be used, for instance, in qubits of quantum computing devices to increase coherency of the quantum computing system. In some examples, an etch process (e.g., a wet etch or plasma-based dry etch process) may reduce one or more impurities from the surface of the superconducting devices and the substrate on which the superconducting devices are provided.

Superconducting qubits can include non-linear inductive element(s) formed by a superconducting tunnel junction, such as a Josephson junction. A Josephson junction can be a tri-layer structure that includes a layer of dielectric insulator sandwiched between layers of superconductor to form a superconductor-insulator-superconductor (SIS) junction. Example Josephson junctions can include layers of aluminum superconductor with an aluminum oxide (e.g., $Al_yO_x$, such as $Al_2O_3$) dielectric layer. Josephson junctions can be useful for at least the reason that aluminum forms a native aluminum oxide when exposed to oxygen. The native oxide can be self-limiting in that the oxide layer can resist the transport of additional oxygen to the metal interface. The native oxide layer can be conformal to the superconducting aluminum surface. Compared to other native oxides, the aluminum oxide is relatively free of pin holes that can introduce electrical shorts in the superconducting tunnel junction.

Superconducting tunnel junctions having an aluminum oxide layer as the dielectric layer, however, can suffer from several disadvantages. For instance, when forming the aluminum oxide layer, small defects, such as aluminum oxide nodules, may be formed on and around the qubit structure, such as around, for instance, the superconducting tunnel junctions. These impurities can appear as "scales" surrounding the qubit structure (e.g., around the superconducting tunnel junctions, capacitors, resonators, and signal lines) and may lead to energy loss, qubit decoherence, and low quantum gate fidelity. In some cases, the nodules may be concentrated at the edge of patterns, where the electrical field is the strongest, leading to high energy loss.

Aspects of the present disclosure are discussed with reference to impurities formed around a superconducting tunnel junction portion of a qubit structure for purposes of illustration and discussion. Those of ordinary skill in the art, using the disclosures provided herein, will understand that the reduction of impurities according to example embodiments is applicable to any portion of the qubit structure or other superconducting device.

According to example aspects of the present disclosure, a quantum computing system, such as a quantum processor, can include a qubit structure (e.g., a qubit structure inside the quantum computing system). The qubit structure can include a superconducting tunnel junction (e.g., a Josephson junction). The superconducting tunnel junction can include a first superconducting layer (e.g., aluminum layer) and a second superconducting layer (e.g., aluminum layer). The superconducting layers may be superconducting at temperatures of about 3 Kelvin or below. A barrier layer (e.g., insulating dielectric layer) can be between the first superconducting layer and the second superconducting layer. The barrier layer can be, for instance, a layer of aluminum oxide.

The superconducting tunnel junction can be formed on a substrate. In some embodiments, the substrate is a silicon substrate to provide a low loss dielectric substrate. Other suitable substrates can be used without deviating from the scope of the present disclosure. For instance, the substrate can be silicon, sapphire, $MgAl_2O_4$ or other suitable substrate.

The superconducting tunnel junction may have a junction area. The junction area is the total area of a two-dimensional shape corresponding to a region where the first superconducting layer and the second superconducting layer overlap and form a junction. In some examples, the superconducting tunnel junction may have a junction area of, for example, about 6400 $nm^2$ or less. In some embodiments, the junction area may be between about 250 $nm^2$ and about 6400 $nm^2$. In some embodiments, the junction area may be between about 250 $nm^2$ to about 1000 $nm^2$. In some embodiments, the junction area may be about 600 $nm^2$ or less. In some embodiments, the junction area may be between about 300 $nm^2$ to about 400 $nm^2$. A small junction area may result in less defects in the junction area (e.g., $AlO_x$ between the two junction legs that overlap), leading to improved device performance.

In some embodiments, the superconducting tunnel junction may have an impurity area adjacent to at least a portion the qubit structure. For instance, the impurity area may be a portion of the substrate proximate to the qubit structure (e.g., proximate to the first superconducting layer) that includes one or more impurities (e.g., nodules). The impurity area may have a plurality of widths including a maximum width. A width of the impurity area may be defined as a lateral distance extending perpendicularly from a layer to a farthest edge of the one or more impurities (e.g., nodules). In some examples, the superconducting tunnel junction may include an impurity area with a maximum width of about 50 nanometers or less, such as about 35 nanometers or less, such as about 25 nanometers or less. In some examples the maximum width may be about zero nanometers (e.g., 5 nanometers or less).

Example aspects of the present disclosure are directed to a method of forming a superconducting tunnel junction having reduced or eliminated impurities. The method can include forming a first layer on a substrate. When forming the first layer, unwanted impurities (e.g., aluminum nodules) may form around the first layer on the substrate. In some embodiments, and as discussed above, the substrate may be silicon, sapphire, $MgAl_2O_4$, or other suitable substrate.

The method can include forming a barrier layer on the first layer. For instance, a non-conducting layer including, for example, aluminum oxide, can be formed on the first aluminum layer such that the non-conducting barrier layer is on the first aluminum layer. During the deposition of the first aluminum layer, unwanted aluminum nodules are formed along the edges of the junction legs, as well as edges other patterns in the qubit structure. These aluminum nodules may become aluminum oxide (at least partially) during barrier formation.

The method may further include forming a second superconducting layer on the non-conducting barrier layer. The second aluminum layer may be, for instance, on the barrier layer. The barrier layer may then, as a result, be sandwiched between the first aluminum layer and the second aluminum layer. During the deposition of the second aluminum layer, unwanted aluminum nodules are formed along the edges of the junction legs, as well as the edges of all the other patterns not protected by photoresist or other films. These aluminum nodules become aluminum oxide (at least partially) when the substrate is taken out of the vacuum chamber and exposed to air.

The method includes performing an etch process on the substrate to remove impurities from the superconducting tunnel junction and substrate. The etch (e.g., a wet etch or plasma-based dry etch) process may reduce any impurities to below a certain height (e.g., about 8 nm or less) or may reduce the number of impurities to a certain quantity. In some embodiments, the etch process may eliminate the impurities entirely. The etch process may be performed for a process period. In some examples, the process period may be, for instance, about 3 minutes. The etch process may also be performed for other process periods without deviating from the scope of the present disclosure.

In some embodiments, the etch process (e.g., a wet etch or plasma-based dry etch process) may reduce the width or total area of the impurity area. In some embodiments, the etch process may reduce the maximum width of the impurity area to, for instance, about 50 nanometers or less, such as about 35 nanometers or less, such as about 25 nanometers or less. In some embodiments, the etch process may reduce the maximum width of the impurity area to about 0 nanometers (e.g., 5 nanometers or less).

In some embodiments, a photoresist or other mask layer may be applied to the second superconducting layer (e.g., aluminum layer) to mask the superconducting tunnel junction and other components on the substrate before performing the etch process. The photoresist or other mask layer may be removed after performing the etch process.

Aspects of the present disclosure provide a number of technical effects and benefits. For instance, a superconducting tunnel junction with reduced impurities according to example embodiments of the present disclosure can improve the coherence of quantum devices (e.g., quantum processors) having qubit structures using these superconducting tunnel junctions, increasing the quantum computing capability (e.g., quantum circuit depth) of quantum devices and can provide for greater quantum gate fidelity.

With reference now to the FIGS., example embodiments of the present disclosure will be discussed in further detail. As used here, the use of the term "about" in conjunction with a value refers to within 20% of the value.

FIG. 1 depicts an example quantum computing system 100. The system 100 is an example of a system of one or more classical computers and/or quantum computing devices in one or more locations, in which the systems, components, and techniques described below may be implemented. Those of ordinary skill in the art, using the disclosures provided herein, will understand that other quantum computing devices or systems may be used without deviating from the scope of the present disclosure.

The system 100 includes quantum hardware 102 in data communication with one or more classical processors 104. The classical processors 104 may be configured to execute computer-readable instructions stored in one or more memory devices to perform operations, such as any of the operations described herein. The quantum hardware 102 includes components for performing quantum computation. For example, the quantum hardware 102 includes a quantum system 110, control device(s) 112, and readout device(s) 114 (e.g., readout resonator(s)). The quantum system 110 may include one or more multi-level quantum subsystems, such as a register of qubits (e.g., qubits 120). In some implementations, the multi-level quantum subsystems may include superconducting qubits, such as flux qubits, charge qubits, transmon qubits, gmon qubits, etc.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 110 via multiple control lines that are coupled to one or more control devices 112. Example control devices 112 that operate on the register of qubits may be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust the frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum hardware 102 through physical control parameters (e.g., microwave pulses) that are sent through wires included in the quantum hardware 102. Further examples of control devices include arbitrary waveform generators, wherein a DAC (digital to analog converter) creates the signal.

The readout device(s) 114 may be configured to perform quantum measurements on the quantum system 110 and send measurement results 108 to the classical processors 104. In addition, the quantum hardware 102 may be configured to receive data specifying physical control qubit parameter values 106 from the classical processors 104. The quantum hardware 102 may use the received physical control qubit parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

In some implementations, the readout device(s) 114 may take advantage of a difference in the impedance for the $|0\rangle$ and $|1\rangle$ states of an element of the quantum system, such as a qubit, to measure the state of the element (e.g., the qubit). For example, the resonance frequency of a readout resonator may take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter may be used in conjunction with the readout device(s) 114 to impede microwave propagation at the qubit frequency.

In some embodiments, the quantum system 110 may include a plurality of qubits 120 arranged, for instance, in a two-dimensional grid 122. For clarity, the two-dimensional grid 122 depicted in FIG. 1 includes 4×4 qubits, however in some implementations the quantum system 110 may include a smaller or a larger number of qubits. In some embodiments, the multiple qubits 120 may interact with each other through multiple qubit couplers, e.g., qubit coupler 124. The qubit couplers may define nearest neighbor interactions between the multiple qubits 120. In some implementations, the strengths of the multiple qubit couplers are tunable parameters. In some cases, the multiple qubit couplers included in the quantum computing system 100 may be couplers with a fixed coupling strength.

In some implementations, the multiple qubits 120 may include data qubits, such as qubit 126 and measurement qubits, such as qubit 128. A data qubit is a qubit that participates in a computation being performed by the system 100. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 120 may be operated using respective operating frequencies, such as an idling frequency and/or an interaction frequency and/or readout frequency and/or reset frequency. The operating frequencies may vary from qubit to qubit. For instance, each qubit may idle at a different operating frequency. The operating frequencies for the qubits 120 may be chosen before a computation is performed.

Figure 2:
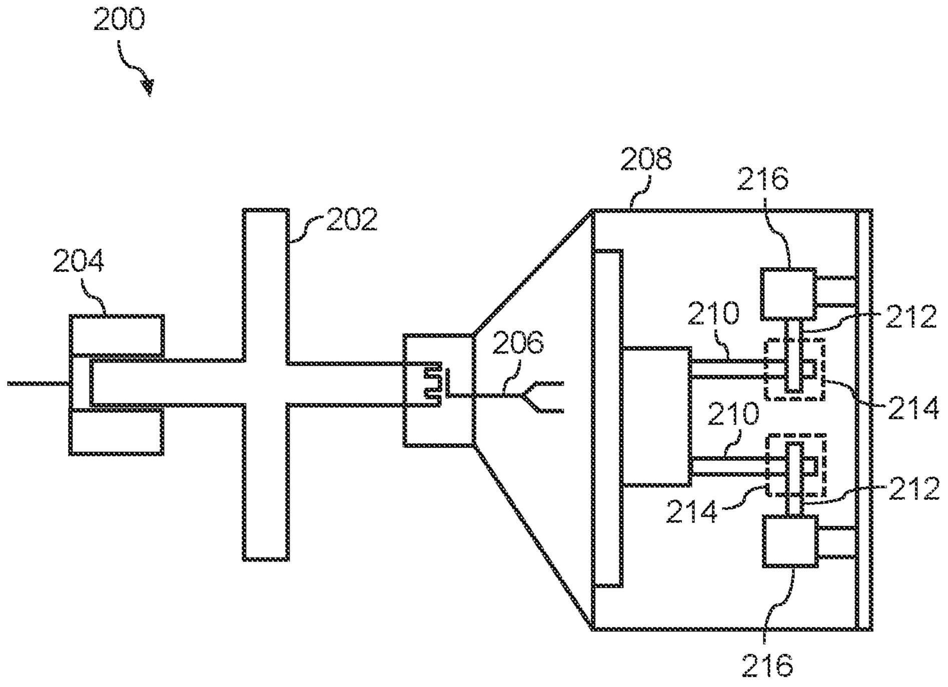
FIG. 2 depicts an example qubit structure having a superconducting tunnel junction according to example embodiments of the present disclosure.

FIG. 2 depicts an example qubit structure 200 according to example aspects of the present disclosure. The qubit structure 200 is an example quantum hardware structure that may be used to execute quantum processes. In some embodiments, the qubit structure 200 may be, for instance, a portion of a quantum processor. The qubit structure 200 may be found in, for example, a quantum computing device. The qubit structure 200 includes a qubit electrode 202 and a resonator 204. The resonator 204 may work in conjunction with the qubit electrode 202 to perform, for example, quantum processes. A waveguide 206 may be coupled to the qubit structure 200, more specifically, the qubit electrode 202. The waveguide 206 may, for instance, measure the quantum state of the qubit structure 200. In some embodiments, the waveguide 206 may be coupled to the qubit structure 200 via a DC-SQUID 208.

The DC-SQUID 208 may include, for example, a superconducting tunnel junction 214 (e.g., Josephson junction) connecting the waveguide 206 to the qubit structure 200. In some embodiments, the superconducting tunnel junction 214 (e.g., Josephson junction) couples the qubit electrode 202 of the qubit structure. In some embodiments the DC-SQUID 208 may further include parasitic junction(s) 216. The parasitic junction may, for instance, couple the superconducting tunnel junction 214 to the waveguide 206.

The superconducting tunnel junction 214 (e.g., Josephson junction) may further include a first layer 210 and a second layer 212. In some embodiments, the first layer 210 and the second slayer 212 may be a superconducting material such as, for example, aluminum. The superconducting material may be superconducting at a temperature of less than about 3 Kelvin. The superconducting tunnel junction may further include a barrier layer (e.g., insulating dielectric layer) (not shown) between the first layer 210 and the second layer 212. In some embodiments, the barrier layer (e.g., insulating dielectric layer) may be a nonconducting material. For example, the barrier layer (e.g., insulating dielectric layer) may include aluminum oxide (e.g., $Al_xO_y$, such as $Al_2O_3$).

FIG. 2 depicts one example qubit structure 200 that may include superconducting tunnel junctions according to example aspects of the present disclosure. Those of ordinary skill in the art, using the disclosure provided herein will understand that the superconducting tunnel junctions may be used in other structures without deviating from the scope of the present disclosure.

In addition, aspects of the present disclosure are discussed with reference to impurities (e.g., nodules) disposed around the superconducting tunnel junction 214 of a qubit structure 200 for purposes of illustration and discussion. Those of ordinary skill in the art, using the disclosures provided herein, will understand that impurities (e.g., nodules) may be formed during different aspects of the qubit structure formation process, and at different locations around the qubit structure 200. For example, impurities may be formed around the resonator 204, qubit electrode 202, or DC-SQUID 208 of the qubit structure 200. Similarly, aspects of the present disclosure are discussed with reference to methods for removal of impurities around superconducting tunnel junctions for purposes of illustration and discussion. Those of ordinary skill in the art, using the disclosures provided herein, will understand that the methods for removing impurities (e.g., nodules) from around the superconducting tunnel junction 214 may be performed all over the qubit structure 200. For example, the methods for removing impurities may be performed on the resonator 204, qubit electrode 202, or DC-SQUID 208. In some embodiments, impurities may be formed around the qubit structure 200 and may include aluminum nodules or aluminum oxide nodules formed after the aluminum nodules oxidize. In one embodiment, impurities, such as aluminum oxide nodules, may be formed around the superconducting tunnel junction 214 of the qubit structure 200.

Figure 3:
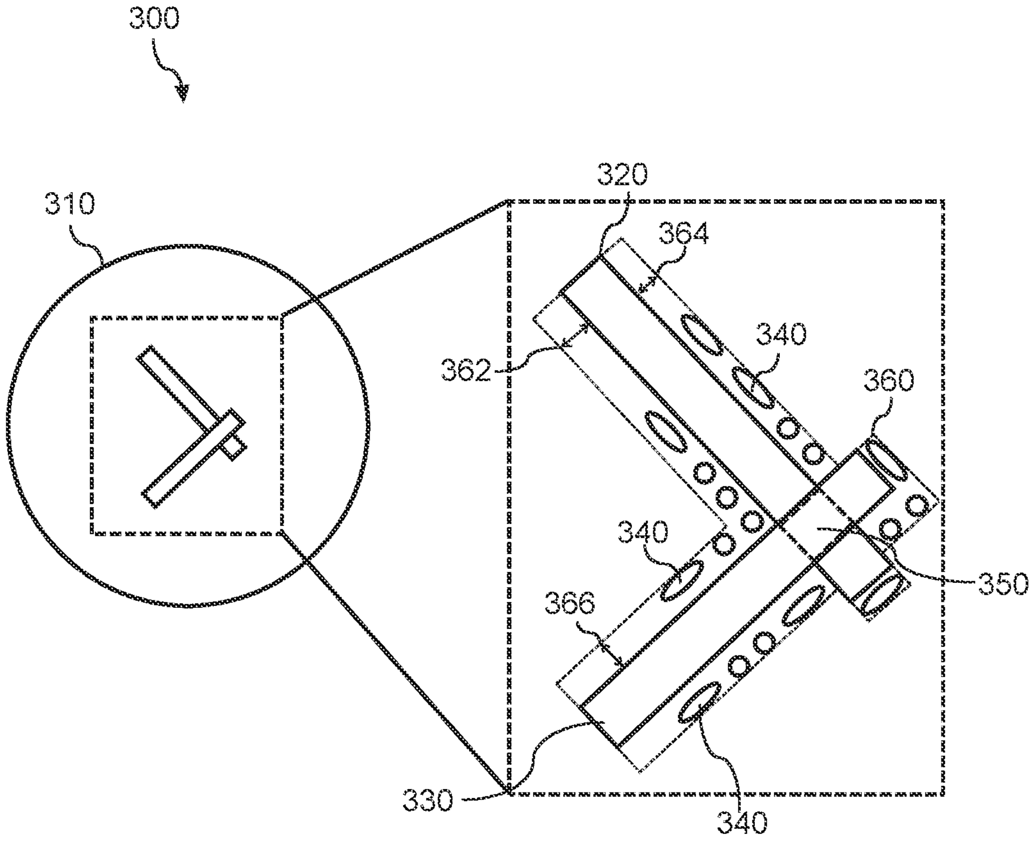
FIG. 3 depicts an example superconducting tunnel junction according to example embodiments of the present disclosure.

For instance, FIG. 3 depicts a qubit structure 300 with a magnified view of a superconducting tunnel junction 305 on a substrate 310. In some embodiments, the substrate 310 is a silicon substrate to provide a low loss dielectric substrate. Other suitable substrates may be used without deviating from the scope of the present disclosure. For instance, the substrate 310 can be silicon, sapphire, $MgAl_2O_4$, or other suitable substrate.

The superconducting tunnel junction 305 may include a first superconducting layer 320 and a second superconducting layer 330. The first superconducting layer 320 and second superconducting layer 330 may include a superconducting material such as, for example, aluminum. The superconducting material may be superconducting at a temperature of less than about 3 Kelvin. While not shown, in some embodiments, the superconducting tunnel junction 305 may further include a barrier layer (e.g., insulating dielectric layer) between the first superconducting layer 320 and the second superconducting layer 330. The barrier layer (e.g., insulating dielectric layer) may be a nonconducting material. For example, the barrier layer (e.g., insulating dielectric layer) may include aluminum oxide (e.g., $Al_xO_y$, such as $Al_2O_3$).

In some embodiments, the qubit structure 300 may include one or more impurities 340. For instance, the one or more impurities 340 may be "scale like" nodules around the first superconducting layer 320 and second superconducting layer 330. The one or more impurities may include a material such as, for example, aluminum oxide (e.g., $Al_xO_y$, such as $Al_2O_3$). The impurities 340 may negatively impact qubit coherence.

In some embodiments, the qubit structure 300 may have an impurity area 360 defined by one or more impurities 340. For instance, the impurity area 360 may be a portion of the substrate 310 proximate to the superconducting tunnel junction 305 that includes one or more impurities 340. The impurity area may be proximate to the first superconducting layer 320 or the second superconducting layer 330. The impurity area 360 may have a plurality of widths 362, 364, 366. Each width is defined as a lateral distance extending perpendicular from one of the superconducting layers 320, 330 to a farthest edge of an impurity 340. The impurity area 360 may have a maximum width, for example, the width 362. The maximum width is defined as the largest of the plurality of widths 362, 364, 366, for example, the width 362.

In some embodiments, the superconducting tunnel junction 305 (e.g., Josephson junction) may further include a junction area 350. The junction area 350 may be the total area of a two-dimensional shape corresponding to a region where the first superconducting layer 320 and second superconducting layer 330 overlap and form a junction. In some examples, the superconducting tunnel junction may have a junction area of, for example, about 6400 $nm^2$ or less. In some embodiments, the junction area may be between about 250 $nm^2$ and about 6400 $nm^2$. In some embodiments, the junction area may be between about 250 $nm^2$ to about 1000 $nm^2$. In some embodiments, the junction area may be about 600 $nm^2$ or less. In some embodiments, the junction area may be between about 300 $nm^2$ to about 400 $nm^2$.

In some examples, the maximum width of the impurity area 360 may be about 50 nanometers or less, such as about 35 nanometers or less, such as about 25 nm or less, such as about 10 nm or less. In some embodiments, the maximum width of the impurity area 360 may be about zero nanometers (e.g., 5 nanometers or less).

Figure 4:
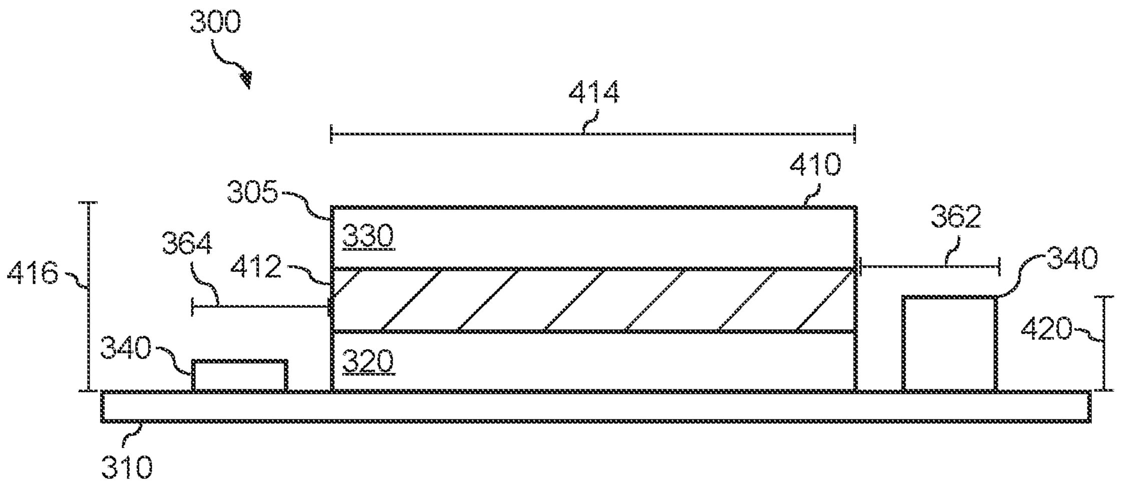
FIG. 4 depicts a side view of an example superconducting tunnel junction according to example embodiments of the present disclosure.

Referring now to FIG. 4, a cross-section view of a qubit structure 300 (e.g., qubit electrode) is shown. More specifically, a cross section view of a superconducting tunnel junction 305 (e.g., Josephson Junction) is depicted. The superconducting tunnel junction 305 may include one or more layers such as, for example, a first superconducting layer 320, a barrier layer (e.g., insulating dielectric layer) 412, and a second superconducting layer 330.

In some examples, the superconducting tunnel junction 305 may be on a substrate 310. For instance, the first superconducting layer 320 may be on the substrate 310. The barrier layer (e.g., insulating dielectric layer) 412 may be formed onto the first superconducting layer 320 and the second superconducting layer 330 may be formed onto the barrier layer (e.g., insulating dielectric layer) 412 such that the barrier layer (e.g., insulating dielectric layer) 412 is between the first superconducting layer 320 and the second superconducting layer 330. In some instances, the first superconducting layer 320 and the second superconducting layer 330 may be formed such that the first superconducting layer 320 and the second superconducting layer 330 are at least partially overlapping.

The first superconducting layer 320 and second superconducting layer 330 may be a superconducting material such as, for example, aluminum. The superconducting material may be superconducting at a temperature of less than about 3 Kelvin. In some embodiments, the barrier layer 412 (e.g., insulating dielectric layer) may be a nonconducting material such as, for example aluminum oxide (e.g., $Al_yO_x$, such as $Al_2O_3$). The superconducting tunnel junction 305 may further include height 416 with varying sizes. In some embodiments, the height 416 may be greater than about 50 nm. The superconducting tunnel junction 305 may have a width 414 of the junction area.

In some embodiments, the qubit structure 300 may include one or more impurities 340. The one or more impurities 340 may have a maximum impurity height 420. In one embodiment, the maximum impurity height 420 may be about 8 nm. In another embodiment, the maximum impurity height 420 may be about 0 (e.g., 5 nm or less). In some embodiments, the one or more impurities 340 may be within an impurity area (not shown) having a plurality of widths 362, 364. A width of the plurality of widths 362, 364 is defined as the distance from, and perpendicular to, an edge of the first superconducting layer 320 or the second superconducting layer 330 to a farthest edge of the one or more impurities 340. In some examples, the qubit structure 300 may have an impurity area with a maximum width. The maximum width is defined as the largest of the plurality of widths 362, 364 for example, the width 362. The superconducting tunnel junction 305 may further include a junction area. The junction area is defined as the region of overlap between the first superconducting layer 320 and the second superconducting layer 330. The junction area may have a width 414. In some examples, the impurity area may have a maximum width of about 50 nanometers or less, such as about 35 nanometers or less, such as about 25 nm or less, such as about 10 nm or less. In some embodiments, the maximum width of the impurity area 360 may be about zero nanometers (e.g., 5 nanometers or less).

Figure 5:
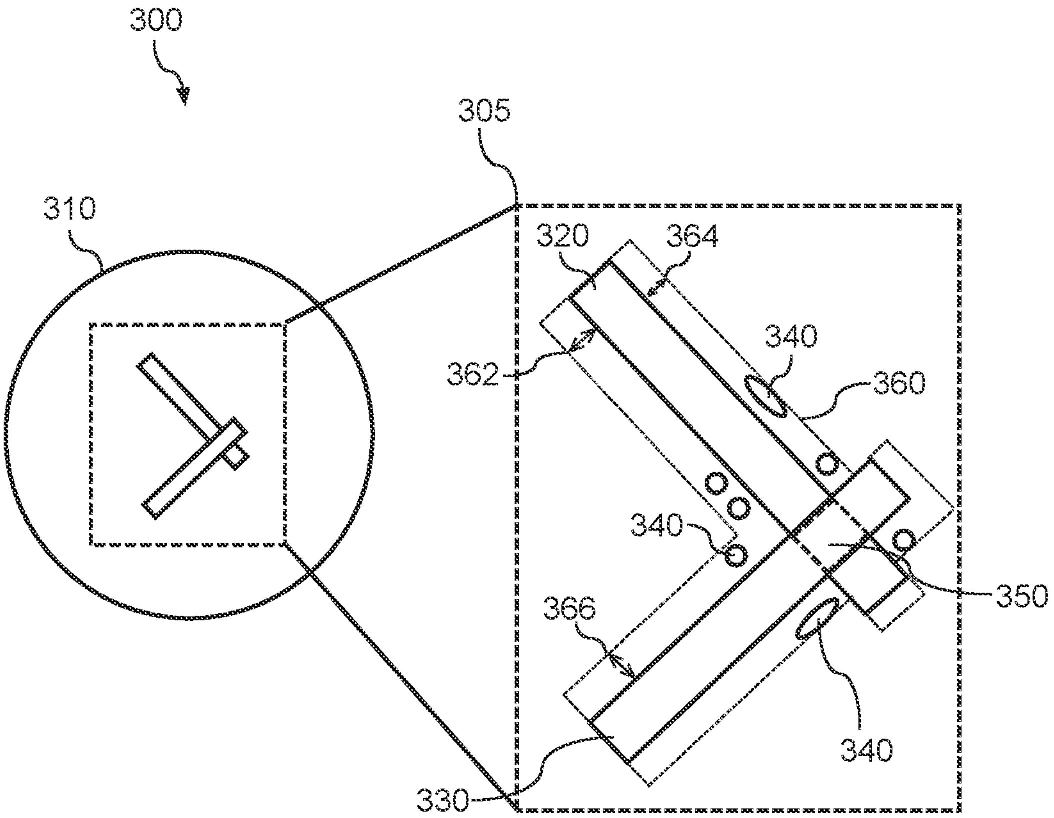
FIG. 5 depicts an example superconducting tunnel junction according to example embodiments of the present disclosure.

FIG. 5 depicts the qubit structure 300 of FIG. 3 after an etch process (e.g., a wet etch or plasma-based dry etch process) has been performed according to example aspects of the present disclosure. In some embodiments, the impurity area 360 may be reduced in size using a wet etch process or a plasma etch process. For example, the one or more impurities 340 may be removed from the substrate 310, thus reducing the impurity area 360. In some embodiments, the impurity area 360 may be eliminated from the superconducting tunnel junction 305. As shown in FIG. 5, a maximum width of the impurity area 360 has been reduced. In some embodiments, the impurity area 360 may be reduced such that a maximum width of the impurity area 360 is about 50 nanometers or less, such as about 35 nm or less, such as about 25 nm or less, such as about 10 nm or less.

Figure 6:
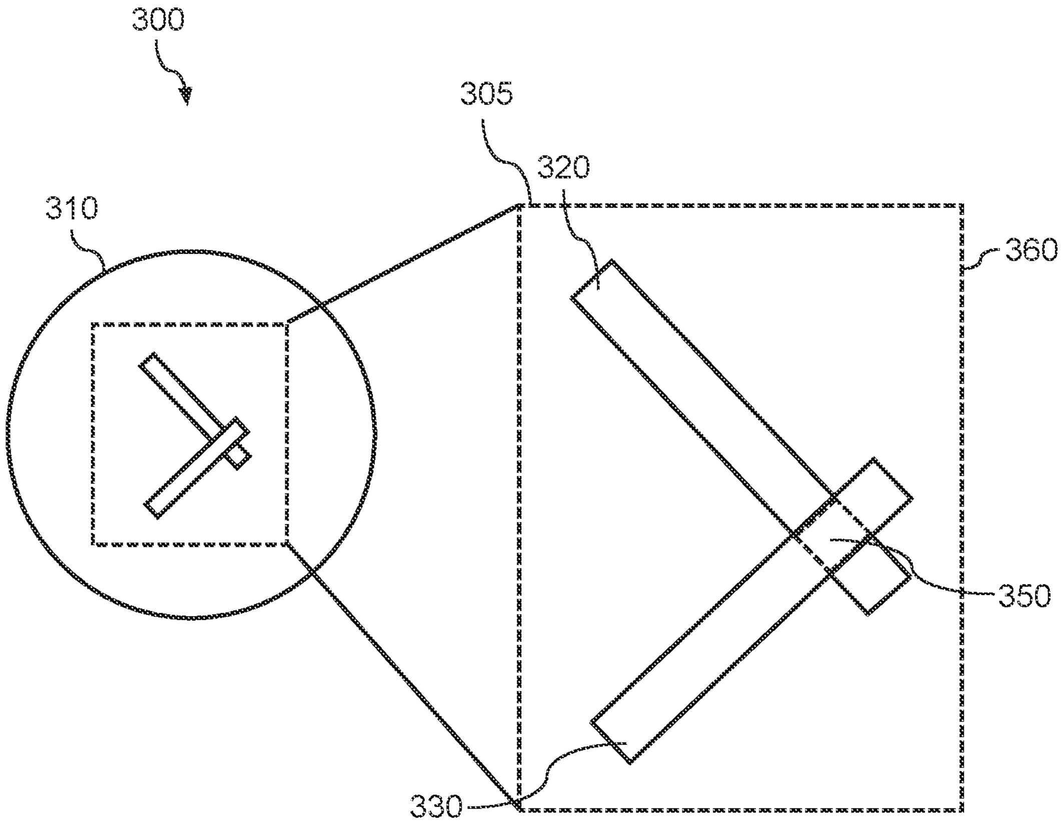
FIG. 6 depicts an example superconducting tunnel junction according to example embodiments of the present disclosure.

Referring now to FIG. 6, the qubit structure 300 of FIG. 3 is depicted after an etch process (e.g., a wet etch or plasma-based dry etch process) has been performed according to example aspects of the present disclosure. In some embodiments, the impurity area 360 may be eliminated using an etch process. As shown in FIG. 6, a maximum width 362, 364, 366 of the impurity area 360 has been reduced to zero. For instance, in some embodiments, the maximum width of the impurity area 360 may be about zero nanometers (e.g., 5 nanometers or less).

Figure 7:
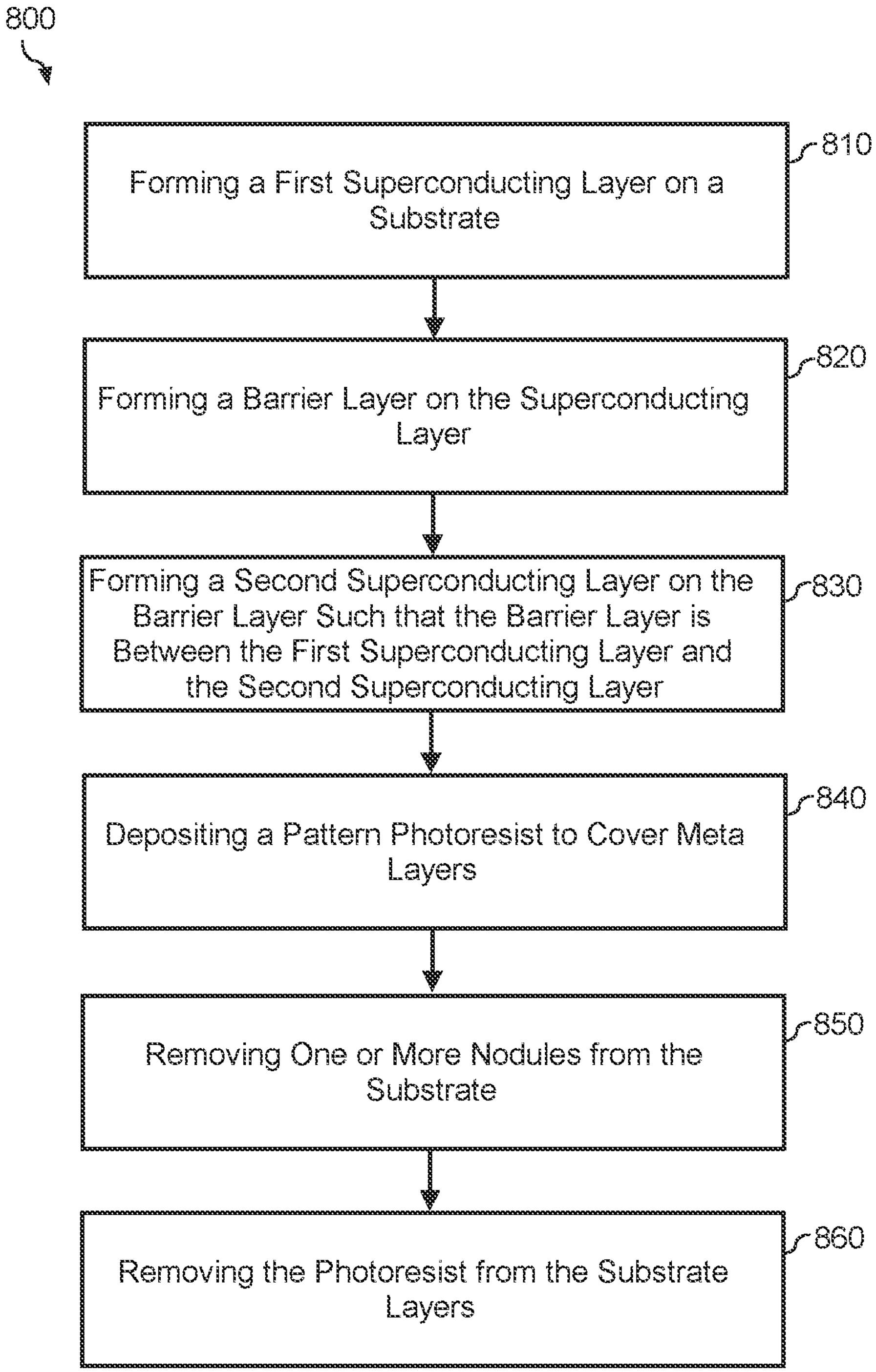
FIG. 7 depicts an example process for forming a superconducting tunnel junction according to example embodiments of the present disclosure.

Now referring to FIG. 7, a flow diagram of an example method 800 for forming a superconducting tunnel junction according to example aspects and embodiments of the present disclosure is depicted. The method 800 illustrates steps performed in a particular order for purposes of illustration and discussion. Those of ordinary skill in the art, using the disclosures provided herein, will understand the various steps of any of the methods described herein can be adapted, modified, rearranged, omitted, include steps not illustrated, and/or expanded in various ways without deviating from the scope of the present disclosure.

At 810, the method can include forming a first superconducting layer on a substrate. The first superconducting layer may include a superconducting material such as, for example, aluminum. The superconducting material may be superconducting at a temperature of less than about 3 Kelvin. The substrate can be for instance, silicon, sapphire, $MgAl_2O_4$, or other suitable substrate. The first superconducting layer may include a first junction leg and an one or more nodules (later forming an impurity area) proximate to the first junction leg. For example, as the first junction leg of the first superconducting layer is formed, nodules are created proximate to the first junction leg.

At 820, the method can include forming a barrier layer on the first superconducting layer. The barrier layer can be, for example, a dielectric insulating layer. For instance, the barrier layer can be aluminum oxide (e.g., $Al_yO_x$, such as $Al_2O_3$). In some examples, the barrier layer is formed such that the barrier layer is covering the first superconducting layer. The nodules may be oxidized to form the impurity area during formation of the barrier layer.

At 830, the method further includes forming a second superconducting layer on the barrier layer such that the barrier layer is between the first superconducting layer and the second superconducting layer. In some examples, the second superconducting layer may include a superconducting material such as, for example, aluminum. The superconducting material may be superconducting at a temperature of less than about 3 Kelvin. The second superconducting layer may include a second junction leg and an impurity area proximate to the second junction leg as well as at the edges of other components such as capacitors and resonators. For example, as the second junction leg of the second superconducting layer is formed, an impurity area is created proximate to the second junction leg. In one embodiment, an impurity area may be formed with the first superconducting layer and, as the second superconducting layer is formed, the impurity area is grown.

In some embodiments, the second superconducting layer is formed such that it overlaps the first superconducting layer and forms a junction area. The junction area includes the overlapping area between the first superconducting layer and the second superconducting layer. In some embodiments, the junction area includes the overlapping area between a first junction leg of the first superconducting layer and a second junction leg of the second superconducting layer. In some examples, the superconducting tunnel junction may have a junction area of, for example, about 6400 $nm^2$ or less. In some embodiments, the junction area may be between about 250 $nm^2$ and about 6400 $nm^2$. In some embodiments, the junction area may be between about 250 $nm^2$ to about 1000 $nm^2$. In some embodiments, the junction area may be about 600 $nm^2$ or less, such as between about 250 $nm^2$ to about 600 $nm^2$. In some embodiments, the junction area may be between about 300 $nm^2$ to about 400 $nm^2$.

At 840, the method may optionally include depositing and patterning a photoresist on all layers on the substrate. In some embodiments, the photoresist may be deposited on the second superconducting layer such that it covers the second superconducting layer, the barrier layer, and the first superconducting layer. The impurities are not covered by the photoresist.

At 850, the method further includes removing one or more nodules (e.g., impurities) from the substrate. The nodules (e.g., impurities) may be, for example, aluminum oxide on the substrate in "scale like" nodules. The nodules may include aluminum. In some embodiments, removing one or more nodules may be done using a plasma etch process. In some embodiments, removing one or more nodules may be done using a wet etch process. For instance, a wet etch process may be performed for a process period. The process period may be, for instance, 3 minutes or 5 minutes on the substrate. The process may remove one or more nodules (e.g., impurities) from the substrate. In some examples, the etch process may reduce the height or width of one or more nodules (e.g., impurities) or remove one or more nodules (e.g., impurities).

The wet etch process may be performed with an etching agent. For example, the wet-etch process may be performed by applying Tetramethylammonium hydroxide to the substrate and the one or more nodules thereon. Tetramethylammonium hydroxide is one example etching agent. Other suitable etching agents may be used without deviating from the scope of the present disclosure. The etching agent may then remove the one or more nodules after about 3 minutes and reduce the size of the impurity area. In another example, the etching agent may remove the one or more nodules after about 5 minutes and reduce the size of the impurity area.

At 860, the method may optionally include removing the photoresist from the substrate and/or all metal layers. In some examples, the photoresist may be removed from the second superconducting layer, the barrier layer, the first superconducting layer, and any other layers on the substrate.

One example aspect of the present disclosure is directed to a device including a superconducting tunnel junction. The superconducting tunnel junction may include a first layer. The first layer may include a superconducting material. The superconducting tunnel junction may include a second layer at least partially overlapping the first layer. The second layer may include the superconducting material. The superconducting tunnel junction may include a barrier layer between the first layer and the second layer and a junction area including an overlapping area of the first layer and the second layer. The junction area has a surface area of about 6400 $nm^2$ or less.

In some embodiments, the junction area has a surface area in a range of about 250 to 1000 $nm^2$.

In some embodiments, the junction area has a surface area in a range of about 300 to 400 $nm^2$.

In some embodiments, the superconducting material may include aluminum.

In some embodiments, the barrier layer may include aluminum oxide.

In some embodiments, the device may include an impurity area proximate to the first layer. The impurity area may define an area including one or more impurities.

In some embodiments, a maximum width of the impurity area is about 50 nm or less.

In some embodiments, a maximum width of the impurity area is about 35 nm or less.

In some embodiments, a maximum width of the impurity area is about 0 nm.

In some embodiments, the one or more impurities at least partially include aluminum oxide nodules.

In some embodiments, the one or more impurities have a height of about 50 nm or less.

In some embodiments, the superconducting material is superconducting at a temperature of less than about 3 Kelvin.

In some embodiments, the device is a qubit.

In some embodiments, the device is part of a quantum computing system.

In some embodiments, the device is at least a portion of a quantum processor.

One example aspect of the present disclosure is directed to a device including a superconducting tunnel junction. The superconducting tunnel junction may include a first layer. The first layer may include a superconducting material. The superconducting tunnel junction may include a second layer at least partially overlapping the first layer. The second layer may include the superconducting material. The superconducting tunnel junction may include a barrier layer between the first layer and the second layer, and an impurity area proximate to the superconducting tunnel junction. The impurity area defines an area associated with one or more aluminum oxide nodules. The impurity area has a maximum width of about 50 nm or less.

In some embodiments, the maximum width of the impurity area is about 35 nm or less.

In some embodiments, the maximum width of the impurity area is about 0 nm.

In some embodiments, the one or more aluminum oxide nodules have a height of about 50 nm or less.

In some embodiments, the impurity area has a total area of 0.

In some embodiments, the junction area has a surface area of about 6400 $nm^2$ or less.

In some embodiments, the junction area has a surface area in a range of about 250 to 1000 $nm^2$.

In some embodiments, the junction area has a surface area in a range of about 300 to 400 $nm^2$.

In some embodiments, the superconducting material at least partially may include aluminum.

In some embodiments, the barrier layer may include aluminum oxide.

In some embodiments, the first layer is on a substrate.

In some embodiments, the substrate is a silicon substrate.

In some embodiments, the superconducting material is superconducting at a temperature of less than about 3 Kelvin.

In some embodiments, the device is a qubit.

In some embodiments, the device is part of a quantum computing system.

In some embodiments, the device is at least a portion of a quantum processor.

One example aspect of the present disclosure is directed to a method of forming a superconducting tunnel junction. The method may include forming a first superconducting layer on a substrate. The method may include forming a barrier layer on the first superconducting layer. The method may include forming a second superconducting layer on the barrier layer such that the barrier layer is between the first superconducting layer and the second superconducting layer. The method may include removing one or more nodules from the substrate.

In some embodiments, removing the one or more nodules may include performing a wet-etch process.

In some embodiments, the method may include depositing a photoresist on the second superconducting layer.

In some embodiments, removing one or more nodules may include removing the one or more nodules after depositing a photoresist on the second superconducting layer and removing the photoresist from the second superconducting layer.

In some embodiments, removing the one or more nodules may include removing the one or more nodules such that a maximum width of an impurity area is about 50 nm or less.

In some embodiments, removing the one or more nodules may include removing the one or more nodules such that a maximum width of the impurity area is about 35 nm or less.

In some embodiments, removing the one or more nodules may include removing the one or more nodules such that a width of the impurity area is about 0 nm.

In some embodiments, removing the one or more nodules may include performing a plasma etch process.

Implementations of the digital, classical, and/or quantum subject matter and the digital functional operations and quantum operations described in this specification may be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification may be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium may be a machine-readable storage device, a machine-readable storage substrate, a random or serial access memory device, one or more qubits/qubit structures, or a combination of one or more of them. Alternatively or in addition, the program instructions may be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems may include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus may also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus may optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, may be written in any form of programming language, including compiled or interpreted languages, or declarative or procedural languages, and it may be deployed in any form, including as a stand-alone program or as a module, component, subroutine, or other unit suitable for use in a digital computing environment. A quantum computer program, which may also be referred to or described as a program, software, a software application, a module, a software module, a script, or code, may be written in any form of programming language, including compiled or interpreted languages, or declarative or procedural languages, and translated into a suitable quantum programming language, or may be written in a quantum programming language, e.g., QCL, Quipper, Cirq, etc.

A digital and/or quantum computer program may, but need not, correspond to a file in a file system. A program may be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program may be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification may be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows may also be performed by, and apparatus may also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program may be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory may be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that may store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, may be implemented in a digital and/or quantum computer program product that includes instructions that are stored on one or more tangible, non-transitory machine-readable storage media, and that are executable on one or more digital and/or quantum processing devices. The systems described in this specification, or portions of them, may each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations may also be implemented in combination in a single implementation. Conversely, various features that are described in the context of a single implementation may also be implemented in multiple implementations separately or in any suitable sub combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems may generally be integrated together in a single software product or packaged into multiple software products.

Particular implementations of the subject matter have been described. Other implementations are within the scope of the following claims. For example, the actions recited in the claims may be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of forming a superconducting tunnel junction, the method comprising:

forming a first superconducting layer on a substrate;

forming a barrier layer on the first superconducting layer;

forming a second superconducting layer on the barrier layer such that the barrier layer is between the first superconducting layer and the second superconducting layer; and removing one or more nodules from the substrate, wherein the one or more nodules comprise impurities deposited directly on the substrate at one or more locations that are not in physical contact with the first superconducting layer, the barrier layer, or the second superconducting layer, wherein the one or more nodules comprise a superconducting material used to form at least one of the first superconducting layer and the second superconducting layer, and wherein the one or more nodules were formed during formation of at least one of the first superconducting layer and the second superconducting layer.

2. The method of claim 1, wherein removing the one or more nodules comprises performing a wet-etch process.

3. The method of claim 1, further comprising:

depositing a photoresist covering the first superconducting layer, the barrier layer, and the second superconducting layer but not covering the one or more nodules.

4. The method of claim 1, wherein removing one or more nodules comprises:

removing the one or more nodules after depositing a photoresist on the second superconducting layer; and removing the photoresist from the second superconducting layer.

5. The method of claim 1, wherein removing one or more nodules comprises removing the one or more nodules such that a maximum width of an impurity area is about 50 nm or less.

6. The method of claim 5, wherein removing one or more nodules comprises removing the one or more nodules such that a maximum width of the impurity area is about 35 nm or less.

7. The method of claim 5, wherein removing one or more nodules comprises removing the one or more nodules such that a width of the impurity area is about 0 nm.

8. The method of claim 1, wherein removing the one or more nodules comprises performing a plasma etch process.

9. The method of claim 1, wherein the superconducting tunnel junction has a junction area of about 6400 $nm^2$ or less after removing one or more nodules from the substrate.

10. The method of claim 2, wherein performing the wet-etch process comprises performing the wet-etch process for a process period between 2.4 minutes and 6 minutes.

11. The method of claim 10, wherein the process period is about 3 minutes.

12. The method of claim 10, wherein the process period is about 5 minutes.

13. The method of claim 12, wherein performing the wet-etch process for the process period of about 5 minutes causes the superconducting tunnel junction to have a junction area of about 6400 $nm^2$ or less after removing the one or more nodules from the substrate.

14. The method of claim 10, wherein performing the wet-etch process for the process period between 2.4 minutes and 6 minutes causes the superconducting tunnel junction to have a junction area of about 6400 $nm^2$ or less after removing the one or more nodules from the substrate.

15. The method of claim 1, wherein the one or more nodules have a nodule height less than or equal to 8 nm.

16. The method of claim 9, wherein the junction area is between 200 $nm^2$ and 1000 $nm^2$.

17. The method of claim 16, wherein the junction area is between 240 $nm^2$ and 480 $nm^2$.

* * * * *